(12) United States Patent
Watanabe et al.

(10) Patent No.: US 6,190,493 B1
(45) Date of Patent: Feb. 20, 2001

(54) THIN-FILM MULTILAYER WIRING BOARD AND PRODUCTION THEREOF

(75) Inventors: Ryuji Watanabe, Ibaraki-ken; Takeyuki Itabashi, Hitachi; Osamu Miura, Ibaraki-ken; Akio Takahashi, Hitachiota; Yukio Ookoshi, Mito; Hitoshi Suzuki, Hitachi; Masahiro Suzuki, Iwaki; Tsutomu Imai, Hadano, all of (JP)

(73) Assignee: Hitachi, Ltd., Tokyo (JP)

( * ) Notice: Under 35 U.S.C. 154(b), the term of this patent shall be extended for 0 days.

(21) Appl. No.: 08/975,172

(22) Filed: Nov. 20, 1997

Related U.S. Application Data

(62) Division of application No. 08/675,069, filed on Jul. 3, 1996.

(30) Foreign Application Priority Data

Jul. 5, 1995 (JP) .................................................. 7-169656

(51) Int. Cl.[7] .................................................. H05K 3/00
(52) U.S. Cl. .................................................. 156/300; 156/250
(58) Field of Search .................................................. 156/300, 250

(56) References Cited

U.S. PATENT DOCUMENTS

| | | |
|---|---|---|
| 4,508,749 | 4/1985 | Brannon et al. . |
| 4,764,485 | 8/1988 | Loughran et al. . |
| 4,904,340 | 2/1990 | Miracky et al. . |
| 4,959,119 | 9/1990 | Lantzer . |
| 4,981,715 | 1/1991 | HIrsch et al. . |
| 5,055,907 | * 10/1991 | Jacobs .................................. 257/717 |
| 5,219,639 | 6/1993 | Sugawara et al. . |
| 5,266,446 | * 11/1993 | Chang et al. ........................ 430/314 |
| 5,281,151 | 1/1994 | Arima et al. . |
| 5,308,796 | 5/1994 | Feldman et al. . |
| 5,350,886 | 9/1994 | Miyazaki et al. . |
| 5,420,378 | 5/1995 | Estes et al. . |
| 5,478,972 | 12/1995 | Mizutani et al. . |
| 5,590,461 | 1/1997 | Ishida . |

FOREIGN PATENT DOCUMENTS

| | | |
|---|---|---|
| 0164564 | 5/1985 | (EP) . |
| 0572121 | 12/1993 | (EP) . |
| 5335713 | 12/1993 | (JP) . |
| 8804877 | 6/1988 | (WO) . |

\* cited by examiner

*Primary Examiner*—Francis J. Lorin
(74) *Attorney, Agent, or Firm*—Antonelli, Terry, Stout & Kraus, LLP

(57) ABSTRACT

A thin-film multilayer wiring board comprising a first and a second metallic wiring layers formed on a substrate with an organic insulating layer interposed between the metallic wiring layers, wherein the lands of the first and second metallic wiring layers are electrically connected by via studs made of a conductive metal filler formed by electroless plating, and the difference between the top end diameter and the base diameter of each via stud is 10% or less, or the angle made by the taper of the interface between the insulating layer and each via stud against the axis thereof is 5° or less, can provide a high wiring density and signal transmission performance.

16 Claims, 7 Drawing Sheets

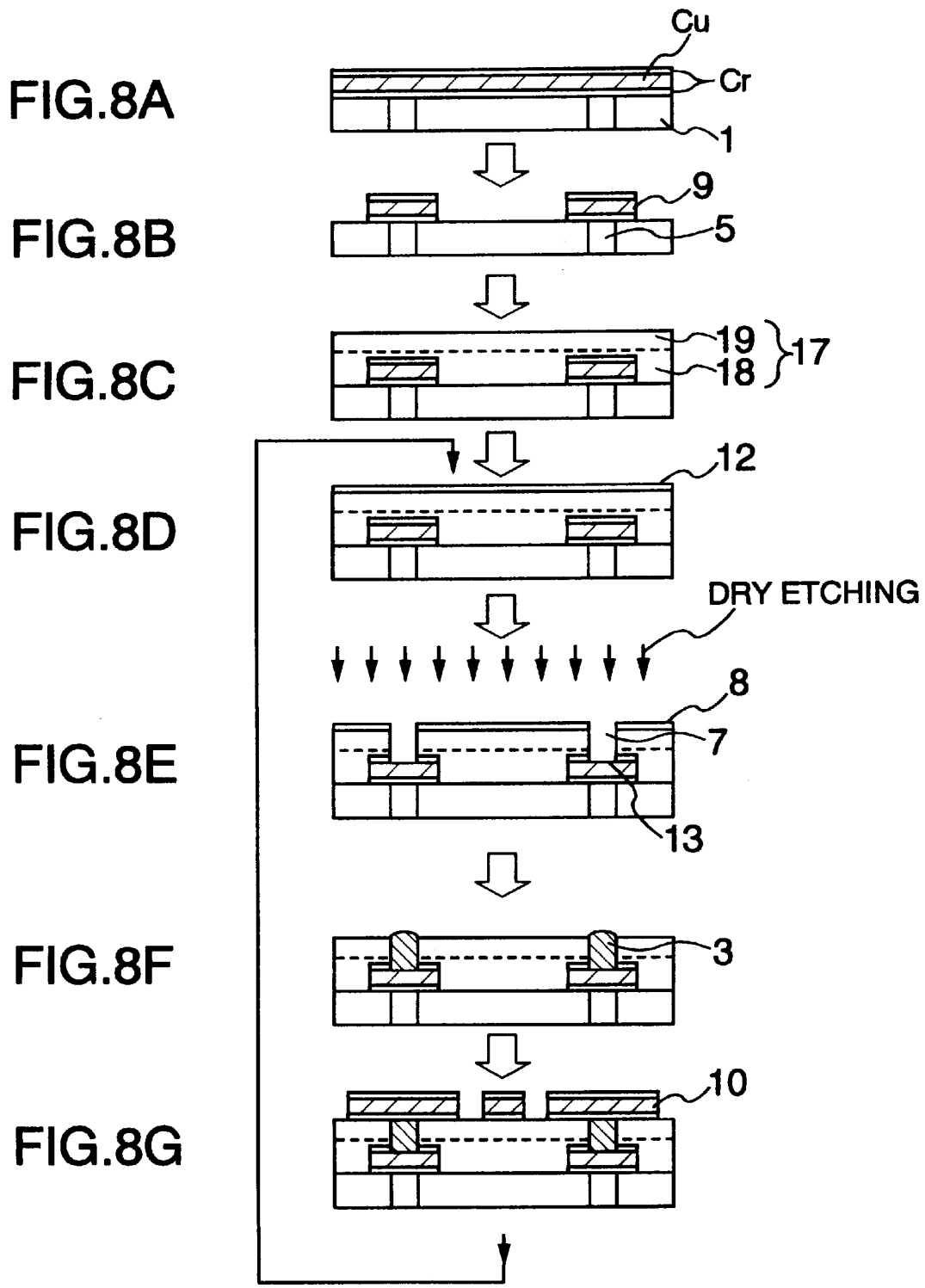

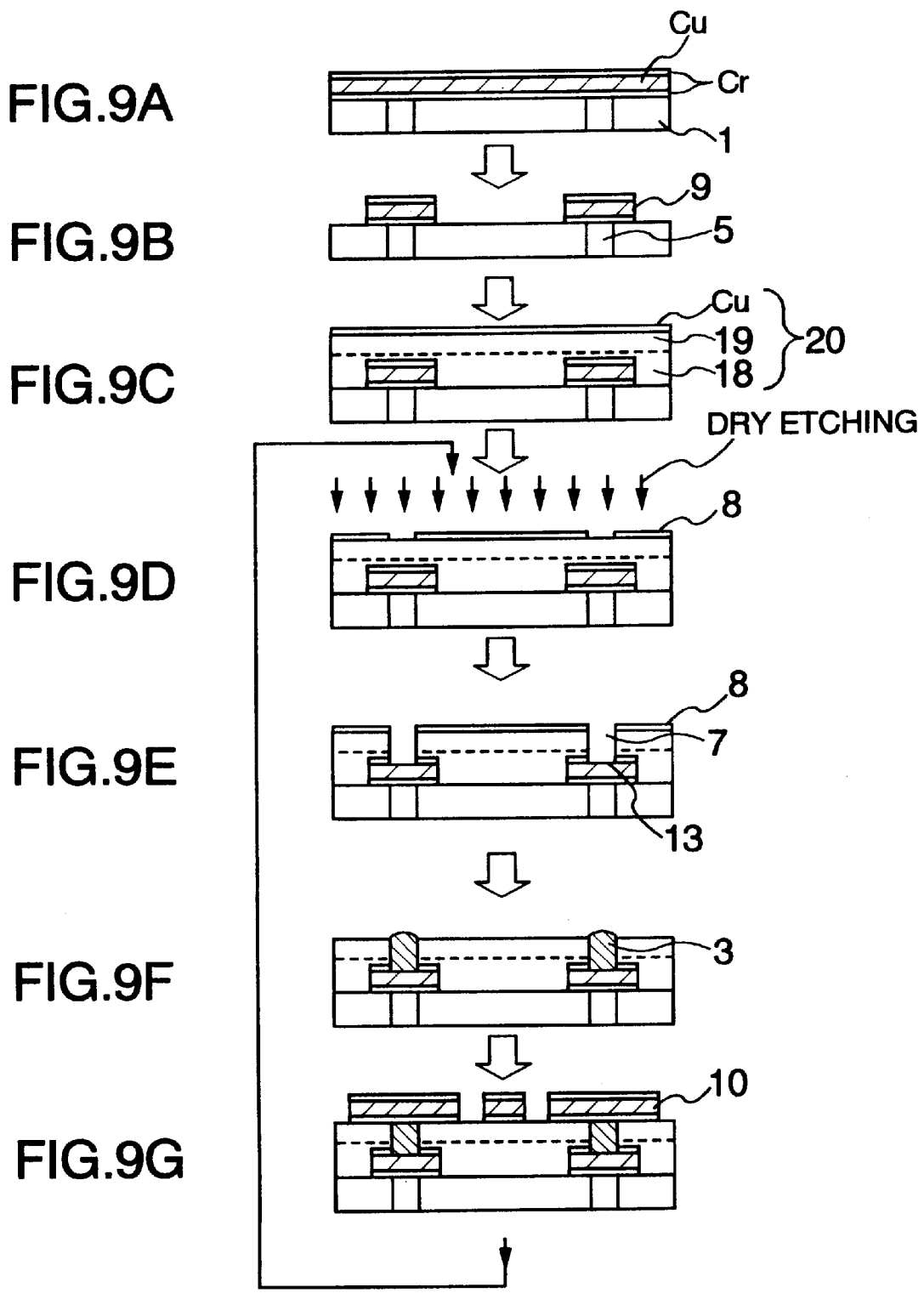

THIN-FILM MULTILAYER WIRING BOARD AND PRODUCTION THEREOF

This application is a Divisional application of application Ser. No. 08/675,069, filed Jul. 3, 1996.

BACKGROUND OF THE INVENTION

The present invention relates to a thin-film multilayer wiring board for being packaged in electronic devices or various types of electrical apparatus, and a process for producing such a wiring board.

For elevating the operating speed of computers, increase of signal transmission speed of the packaging module is an important factor.

Hitherto, a thick-film board comprising a ceramic substrate and a wiring layer principally made of W or Mo and formed on said ceramic substrate by a laminating and sintering method has been used as said module. Recently, however, attention is focused on a thin-film multilayer wiring board in which, in order to realize speed-up of signal transmission, a polyimide film with a low dielectric constant is formed as an interlaminar insulating film on the ceramic substrate, and a conductive layer is made of a highly conductive substance such as Cu, Al, Au or the like.

In recent years, however, computer performance has advanced rapidly and the number of the packaged gates has increased remarkably, entailing the necessity of increasing the number of the wiring layers in the thin-film wiring system.

Several proposals have been made on the thin-film multilayer wiring techniques, wherein a successive laminating system is generally employed. This system comprises forming a conductor layer made of Cu, Al or the like on a ceramic or Si substrate, forming via holes therein, conducting insulating layer patterning by photolithography, and making electrical connections.

Techniques for forming via holes or through-holes of 100 μm or less in diameter are needed for said interlaminar connection. Also, fine patterns with a line width-or space width of 20–50 μm are necessary for thin-film wiring. For instance, it is required to lay 2–5 wires between the 150–500 μm connecting pads. In this case, the via hole diameter needs to be about 20–30 μm. However, the limit of the hole diameter that can be formed by the currently available drilling techniques is about 70 μm, and other means must be applied for forming the holes of smaller diameters.

Recently, attention is drawn to laser working and dry etching as suitable methods for forming fine holes such as mentioned above. Both methods are excellent in fine working, but a difference is seen between them in shape of the holes formed.

It is known that the method using excimer laser is an excellent working method for forming fine via holes or through-holes (JP-A-60-261685). However, the projected shape of the hole formed thereby tends to taper down toward the end (base) with an angle of about 20 to 30° against the axis of the hole.

As a method that can eliminate the above problem, a so-called conformal mask method—a method in which laser working is performed through a mask comprising a metallic film having openings at the pattern portion of an organic insulating layer where holes are to be formed—is effective. According to this method, as shown in FIG. 2, the hole formed has a taper angle (e) of about 15–5° against the axis of the hole when the energy density of the excimer laser is 300 to 1,000 $mJ/cm^2$. Thus the tapering phenomenon toward the end (base) can be suppressed to a considerable degree. The result of the tests conducted by the present inventors shows that the taper angle θ of the hole formed is reduced and its straightness is enhanced proportionally as the energy density increases.

On the other hand, as opposed to said laser working, according to dry etching using oxygen plasma controlled to a low gas pressure (for example, 5 Pa or less), it is possible to form an almost straight hole with a taper angle (θ) less than 5°. It was found from a series of experiments that when the plasma gas pressure becomes higher than 5 Pa in dry etching of an organic insulating layer such as a polyimide layer, the hole formed is curved in section like a barrel.

Such drying etching techniques have been used for wiring or patterning of the insulating layers in the LSI semiconductor manufacturing processes. For instance, a method for forming the contact holes in the interlaminar insulating layer on a semiconductor substrate by dry etching using a reactive gas (a mixed gas of $CF_4$, $CHF_3$, Ar, $O_2$, Cl, etc.) is disclosed in JP-A-4-150023 and JP-A-5-121371. In the former, the etching gas pressure for forming a straight hole is specified to be 0.6 Torr or below (80 Pa or below) while in the latter, the etching gas pressure is defined to be 10 to 50 m Torr (1.33. to 6.65 Pa).

SUMMARY OF THE INVENTION

An object of the present invention is to provide a thin-film multilayer wiring board in which the upper and lower wiring layers of the board are connected by the via studs produced by filling a conductive metal in the fine via holes having a specific diameter (for example, 70 μm or less) formed in an organic insulating layer, and a process for manufacturing such a wiring board.

The present invention provides a thin-film multilayer wiring board comprising a first and a second metallic wiring layers formed on a substrate with an organic insulating layer interposed between the metallic wiring layers, wherein the lands of said first and second metallic wiring layers are electrically connected by via studs which are made of a conductive metal filled in via holes and formed by electroless plating, and if necessary, further comprising one or more metallic wiring layers interposing one or more organic insulating layers therebetween alternately and electrically connected to each previously formed metallic wiring layer by via studs formed in the same manner as mentioned above.

The present invention also provides a thin-film multilayer wiring board comprising a first and a second metallic wiring layers formed on a substrate with an organic insulating layer interposed between the metallic wiring, layers, wherein the lands of said first and second metallic wiring layers are electrically connected by via studs which are made of a conductive metal filled in via holes and formed by electroless plating, and the difference between the top end diameter and the base diameter of said via studs is 10% or less, or the angle made by the taper of the insulating layer interface of each via stud with the axis thereof is 5° or less, and if necessary, further comprising one or more metallic wiring layers interposing one or more organic insulating layers therebetween alternately and electrically connected to each previously formed metallic wiring layer by via studs formed in the same manner as mentioned above.

The present invention further provides a process for producing a thin-film multilayer wiring board which comprises attaching an insulating adhesive sheet to a substrate having a first metallic wiring layer on its surface to form an insulating layer, forming via holes in said insulating layer by dry etching or laser working, filling said via holes with a conductive metal by electroless plating to form via studs, grinding out the portions of said via studs projected from the insulating layer to make said insulating layer surface flat, and forming a second metallic wiring layer on said insulating layer and connecting it to said via studs, and if necessary, repeating the step of attachment of an insulating adhesive to the step of formation of a second metallic wiring layer a plurality of times.

The present invention still further provides a process for producing a thin-film multilayer wiring board, which comprises the steps of (1) laminating a composite sheet comprising a carrier sheet and an adhesive layer on a substrate having a first metallic wiring layer on the surface thereof so as to contact the adhesive layer with the first metallic wiring layer;

(2) removing said carrier sheet and hardening the adhesive layer to form an insulating layer;

(3) forming via holes in said insulating layer;

(4) filling said via holes with a conductive metal by electroless plating;

(5) grinding out projected portions of the conductive metal from the surface of said insulating layer to flatten the conductive metal and to form via studs; and (6) forming a second metallic wiring layer on said insulating layer and connecting it to said via studs, and if necessary, repeating the steps (1) through (6) a plurality of times.

BRIEF DESCRIPTION OF THE DRAWINGS

FIGS. 8A to 8G are a flow sheet of production process of the thin-film multilayer wiring board of Example 2.

FIGS. 9A to 9G are a flow sheet of production process of-the thin-film multilayer wiring board of Example 3.

DESCRIPTION OF THE PREFERRED EMBODIMENTS

Figure 1:
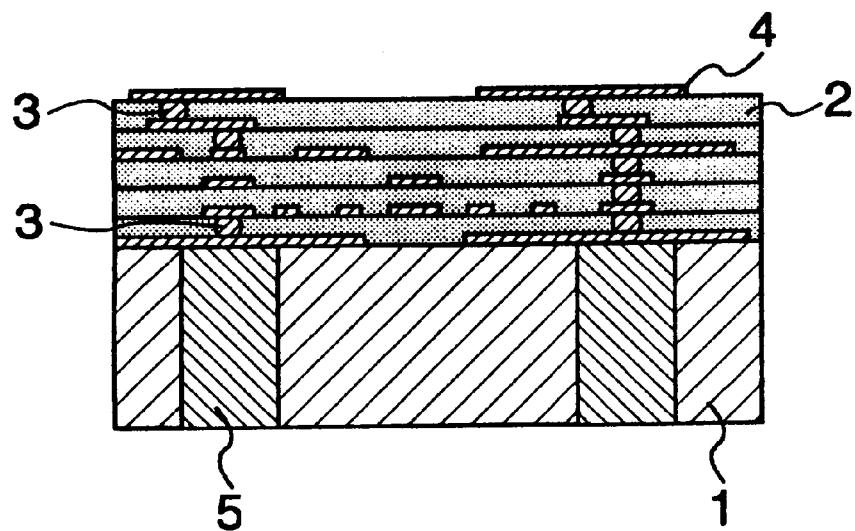
FIG. 1 is a schematic sectional view of a via stud-connected thin-film multilayer board according to the present invention.
Figure 2:
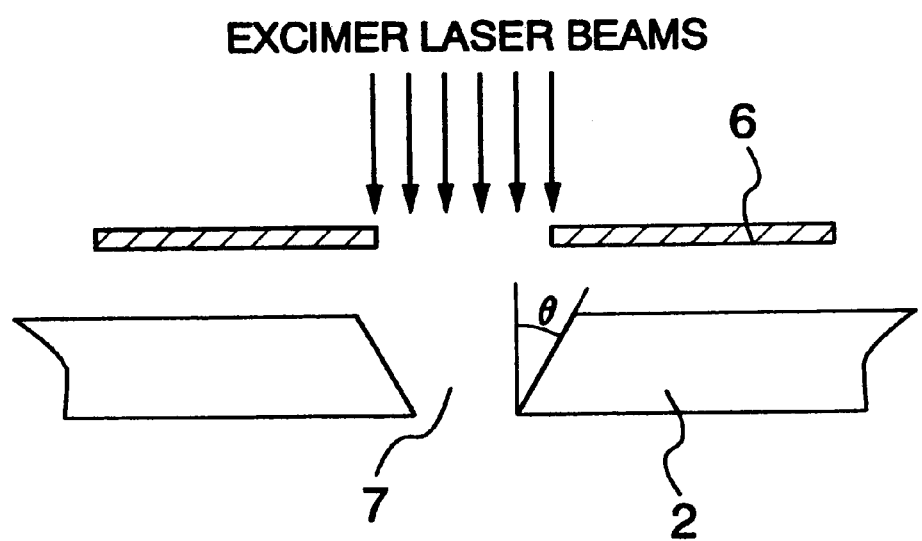
FIG. 2 is a schematic sectional view of a via hole according to the present invention.

The embodiments of the present invention which aims at solving the above problems are as described below.

[1] A thin-film multilayer wiring board comprising a first and a second metallic wiring layers formed on a substrate with an organic insulating layer interposed between the first and second metallic wiring layers, wherein the lands of said first and second metallic wiring layers are electrically connected by via studs which are made of a conductive metal filled in via holes and formed by electroless plating, and if necessary, further comprising one or more metallic wiring layers interposing one or more organic insulating layers therebetween alternately and electrically connected to each previously formed metallic wiring layer by via studs formed in the same manner as mentioned above.

[2] In the above-mentioned thin-film multilayer wiring board, the lands of said first and second metallic wiring layers are electrically connected by via studs which are made of a conductive metal filled in via holes and formed by electroless plating, and the difference between the top end diameter and the base diameter of each of said via studs is 10% or less, or the angle made by the interface between the insulating layer and each via stud against the axis thereof is 5° or less, and if necessary, further comprising one or more metallic wiring layers interposing one or more organic insulating layers therebetween alternately and electrically connected to each previously formed metallic wiring layer by via studs formed in the same manner as mentioned above.

For obtaining a fine thin-film pattern, it is essential to provide the via holes of a taper angle such as specified above so as to secure the wiring area as much as possible.

The term "via stud" mentioned above is not a technical term but often used in the printed circuit process technology. That is, the word "stud" has its original meaning of "rivet, nail or plug", so that it means what is produced by perfectly filling a via hole with something like rivet. In the present invention, it means a columnar connector of the metallic layers for making electrical connections.

[3] In the above-mentioned thin-film multilayer wiring board, said via stud is made of Cu (copper) by electroless plating.

[4] In the above-mentioned thin-film multilayer wiring board, said second metallic wiring layer is made of a metal film formed by vacuum deposition and/or sputtering.

[5] In the above-mentioned thin-film wiring board, the via stud side of the connecting area of each said via stud and said second metallic wiring layer has a grinded or polished face.

[6] A process for producing a thin-film multilayer wiring board, which comprises attaching an insulating adhesive sheet to a substrate having a first metallic wiring layer on its surface to form an insulating layer, forming via holes in said insulating layer by dry etching or laser working, filling said via holes with a conductive metal by electroless plating to form via studs, grinding out the portions of said via studs projected from the insulating layer to make said insulating layer surface flat, and forming a second metallic wiring layer on said insulating layer and connecting it to said via studs, and if necessary, repeating the step of attachment of an insulating adhesive to the step of formation of a second metallic wiring layer a plurality of times.

[7] A process for producing a thin-film multilayer wiring board, which comprises the steps of (1) laminating a composite sheet comprising a carrier sheet and an adhesive layer on a substrate having a first metallic wiring layer on the surface thereof so as to contact the adhesive layer with the first metallic wiring layer;

(2) removing said carrier sheet and hardening the adhesive layer to form an insulating layer;

(3) forming via holes in said insulating layer;

(4) filling said via holes with a conductive metal by electroless plating;

(5) grinding out projected portions of the conductive metal from the surface of said insulating layer to flatten the conductive metal and to form via studs; and (6) forming a second metallic wiring layer on said insulating layer and connecting it to said via studs, and if necessary, repeating the steps (1) through (6) a plurality of times.

[8] A thin-film multilayer wiring board, which comprises a substrate, formed thereon a plurality of metallic wiring layers interposing one or more organic insulating layer therebetween alternately, each land of said metallic wiring layers being electrically connected by via studs made of an electroconductive metal filled in via holes and formed by electroless plating.

[9] In the above-mentioned thin-film multilayer wiring board, the lands of individual metallic wiring layers are electrically connected by via studs made of a conductive metal filled in via holes and formed by electroless plating, and the difference between the top end diameter and the base diameter of each of said via studs is 10% or less, or the angle made by the interface between the insulating layer and each via stud against the axis thereof is 50 or less.

An example of the via stud-connected type thin-film multilayer board according to the present invention is illustrated in FIG. 1. On a substrate 1 made of ceramic or glass-reinforced epoxy is formed an insulating layer 2 (made of, for example, polyimide) having a metallic wiring layer thereon, said metallic wiring layer contacting with the substrate, and via holes are formed in said insulating layer 2. A number of insulating layers 2 each having a metallic wiring layer thereon are laminated while connecting the metallic wiring layers 4 by via studs 3 made of a conductive metal filled in said via holes and formed by electroless plating. The metallic wiring layers 4 connected successively by via studs in the manner described above are laminated, thereby forming a thin-film multilayer wiring board.

Figure 3A:
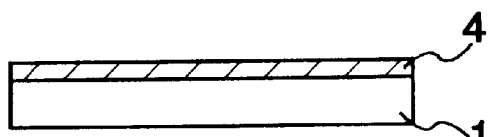
FIGS. 3A to 3H are a flow chart showing, by the schematic sectional views, an example of production process of a via stud-connected type thin-film two-layer wiring board.
Figure 3B:
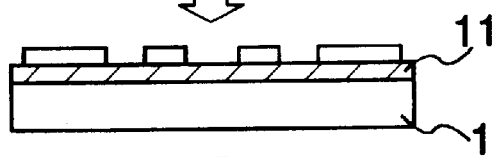
Figure 3C:
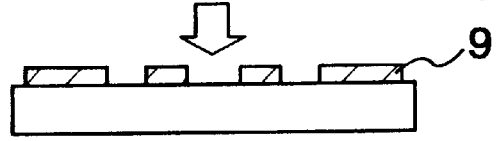

FIGS. 3A to 3B are a flow chart exemplifying a process for producing a thin-film two-layer wiring board (production steps) by schematic sectional views. A resist 11 is formed on a substrate 1 having a metallic wiring layer 4, followed by etching (not shown) to form a first metallic wiring layer 9, and an insulating layer 2 is formed thereon and dry etched through an etching mask 8 to form via holes 7.

Figure 3D:
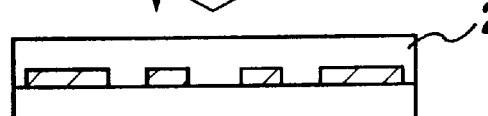
Figure 3E:
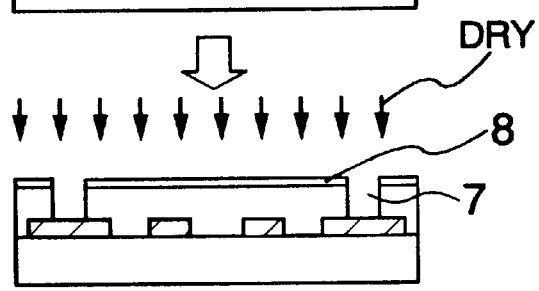
Figure 3F:
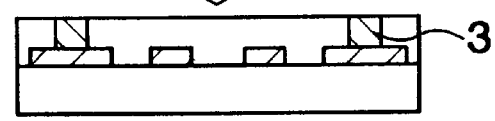
Figure 3G:
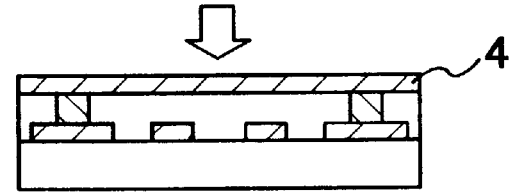
Figure 3H:
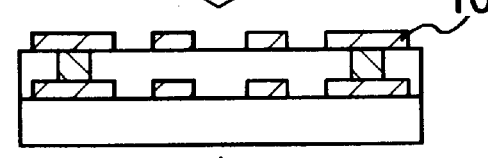

Then the via holes 7 are filled with a conductive metal by electroless plating. Thereafter, a metallic wiring film 4 is formed by vacuum deposition or sputtering, and a second metallic wiring layer 10 is formed by wet etching. It is possible to form a three or more layered wiring board by repeating the step shown by FIG. 3D and the succeeding steps shown in FIGS. 3E to 3H a plurality of times.

As said insulating layer 2, there can be used a film formed by thermosetting a polyimide precursor varnish coating or a composite sheet obtained by forming an adhesive layer on a polyimide film and pressing them into a sheet. A composite sheet is preferred from the viewpoint of workability. It is also possible to use polyamides and epoxy resins as the insulating material.

In said insulating layers (polyimide) are formed the via holes each terminating into a land of the first metallic wiring layer (copper) by dry etching (using oxygen gas plasma) or excimer laser working, and a via stud is grown from the land at the bottom of the hole by electroless plating.

A reason why the electroless plating method is selected for forming the via studs in the present invention is accounted for by the fact that since in the successive laminating method a process is followed in which an insulating layer is formed on a first metallic wiring layer formed on a substrate, generally said metallic wiring pattern is an independent pattern and it is not easy to take out common electrodes as in electroplating. In electroless plating, no such common electrodes are required.

As the conductive metal for making the via studs, there can be used copper, gold, nickel, silver, etc.

An example of working of the through-holes in a double-sided multilayer printed board by electroless plating is disclosed in JP-A-5-335713. In this method, columnar conducting plating is performed in the through-holes in the insulating layer with its backside blocked with a copper foil to form interlaminar connections while at the same time the backside of the insulating layer is connected to the conductor foil on the front side. This method is effective in case the wiring pattern is relatively large and the conductor layer is also thick, such as several ten $\mu$m.

However, in a thin-film multilayer wiring board in which the insulating layers are of a smaller thickness and connected by fine via studs, it is impossible to reduce the thickness of the conductor foil (wiring layer) when such a conductor foil is provided on both sides of the insulating layer as in the above case, so that it is difficult to form a fine pattern on the second metallic wiring layer by wet etching. In the present invention, therefore, a conductor foil (connecting land) is-used for the first wiring layer alone.

Figure 4:
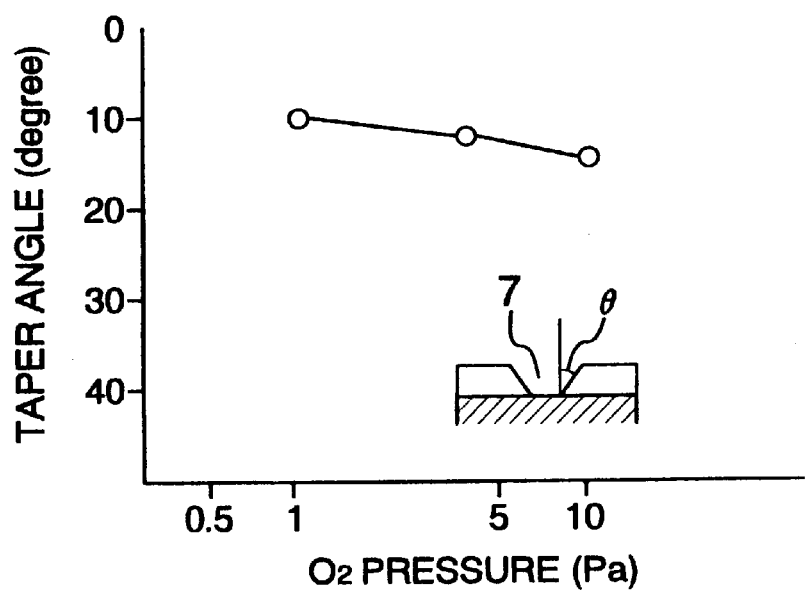
FIG. 4 is a graph showing the relation between the taper angle formed by etching and the partial pressure of oxygen gas.

Regarding formation of the fine via holes for forming the fine via studs, it is possible to form the fine via holes with very high straightness with the taper angle made by the wall surface of the worked hole with the axis thereof being 5° or less (to almost 0°) as shown in FIG. 4 (the taper angle made with the substrate surface being 85° or greater) by controlling the gas pressure at a low level (5 Pa or below to 1 Pa or less) that allows plasma formation.

FIG. 4 shows the relation between said taper angle and the partial pressure of oxygen gas of the plasma when the via holes were formed in a 20 $\mu$m thick polyimide sheet.

When dry etching was carried out by fixing the high frequency (RF) output at 500 W and the oxygen flow rate at 15 ml/min, the taper angle was 10–15° when the partial pressure of oxygen was 1–5 Pa. But the taper angle became greater than 150, and straightness of the formed hole was reduced, when the partial pressure of oxygen was raised to 10 Pa.

Figure 5:
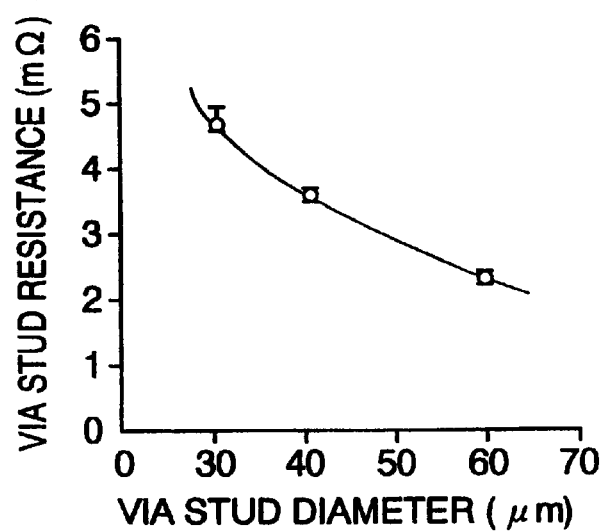
FIG. 5 is a graph showing the relation between via stud diameter and resistivity.

The thin-film multilayer board produced according to the above-described process showed good connecting quality (indicated by connecting rate) of the via studs. The connecting rate was high even when the via hole diameter was 60 $\mu$m or less as shown in Table 1. It was further found that the via stud resistance was also small as shown in FIG. 5.

TABLE 1

| Via hole diameter | Number of normal connections/total sum of connections | Normal connection rate (%) |
| --- | --- | --- |
| 60 $\mu$m | 1128/1128 | 100 |

TABLE 1-continued

| Via hole diameter | Number of normal connections/total sum of connections | Normal connection rate (%) |
|---|---|---|
| 40 μm | 1127/1128 | 99.9 |
| 30 μm | 1127/1128 | 99.9 |

At the section of the via stud formed according to the present invention, the horizontal growth of the plating copper was confirmed even at the top end where plating was terminated. Such flatness of the via stud surface is not only conducive to the betterment of pattern forming precision of photolithography in forming the second metal wiring layer but also enables vertical connection of the second via studs. That is, on the planarly grown via stud surface, there can be formed the connecting wiring lands of the next layer, and immediately thereon the via studs of yet another layer can be placed. Since this allows a reduction of interlaminar wiring length, a speed-up of signal transmission can be attained.

It is also possible to further reduce interlaminar connection resistance by improving the flatness of the via stud surface in addition to flattening grinding and polishing treatments after formation of the via studs.

The via studs formed by filling the via holes with a conductive metal by electroless plating as described above showed high connection reliability in a room temperature and 300° C. heat cycle test, and also suffered almost no change of performance in a high-temperature standing test at 300° C. for 100 hours.

Due to the provision of the via studs with a diameter of 100 μm or less (possibly to submicrons), formation of fine patterns with a line width and a space width of 20 to 50 μm can be realized, making it possible to lay 2 to 5 wires between the 150–500 μm connecting pads.

Also, according to the above-described method in which the composite sheets are bonded, as compared with the successive laminating method in which a polyimide varnish or the like is applied for forming said insulating layers, it is possible to further simplify the production process as no varnish curing step is required, and a thin-film multilayer wiring substrate capable of high-density packaging with high reliability can be offered.

The present invention is illustrated by way of the following Examples.

EXAMPLE 1

An embodiment of the present invention is explained in detail with reference to the accompanying drawings.

FIGS. 6A to 6G are a flow chart showing an example of production process of a copper/polyimide thin-film multilayer wiring board, the illustration being made by schematic sectional views of the substrate in the respective steps.

Figure 6A:
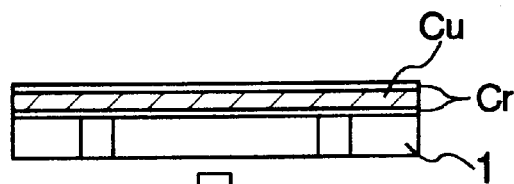
FIGS. 6A to 6G are a flow sheet of production process of the thin-film multilayer wiring board of Example 1.

Step (a): On a 6 mm thick glass-reinforced ceramic substrate, a Cr/Cu/Cr conductor film (Cr: 500 Å thick; Cu: 5 μm thick) which becomes a first metallic wiring layer was formed by sputtering in Ar gas as shown in FIG. 6A.

Figure 6B:
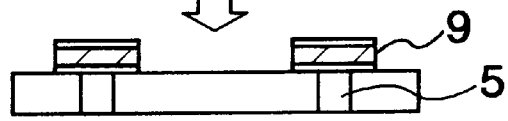

Step (b): A resist pattern (positive resist) was formed on said Cr/Cu/Cr conductor film and wet etched to form a first metallic wiring layer 9 as shown in FIG. 6B.

Figure 6C:
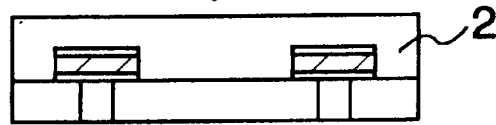

Step (c): On the first metallic wiring layer 9, a 20 μm thick half-cured polyimide adhesive sheet was press bonded at 250° C. under 15 kg/cm² and then cured to form an insulating layer 2 as shown in FIG. 6C.

Figure 6D:
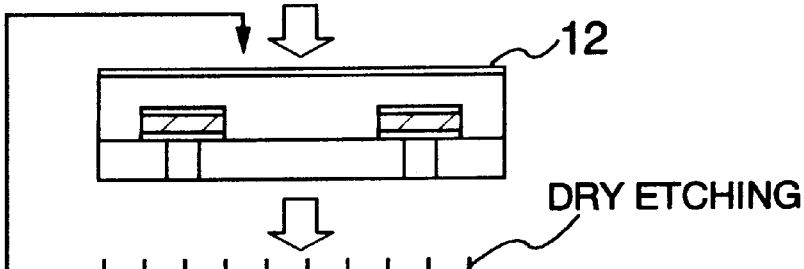

Step (d): Then a 2,000 Å thick Al film 12 was formed by vacuum deposition as a dry etching mask as shown in FIG. 6D.

Figure 6E:
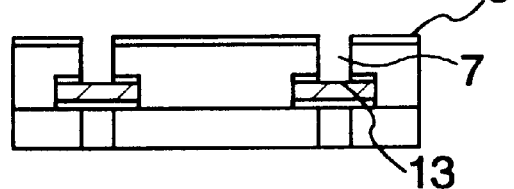

Step (e): A dry etching mask 8 for forming via holes was formed by photoetching, and then via holes 7 were formed by a parallel-plate type dry etching apparatus (not shown) using an oxygen gas plasma with a gas pressure of 3 Pa and an RF output of 500 W as shown in FIG. 6E.

The dry etching time required for forming the via holes 7 is about 80 minutes. When etching is further continued for another 20 to 25 minutes, the Cr layer (500 Å) on the surface of the land 13 at the bottom of each hole is removed to bare out the Cu face. The polyimide dry etching rate was 0.2 to 0.3 μm/min.

Figure 6F:
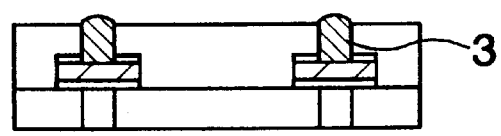

Step (f): Since the surface of the land 13 at the bottom of each via hole was Cu, chemical copper plating (usually called pattern plating) was grown directly with no need of conducting any pretreatment to form a via stud 3 made of Cu in each via hole as shown in FIG. 6F.

The chemical (or electroless) copper plating time required for forming the Cu via studs with a diameter of 30 μm and a height of 25 μm was about 5 hours.

Figure 6G:
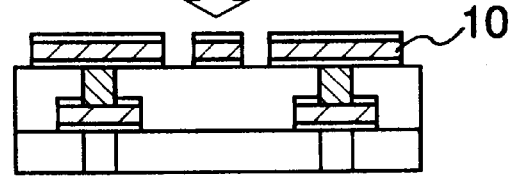

Step (g): On said insulating layer 2, a Cr/Cu/Cr conductor film (Cr: 500 Å thick; Cu; 5 μm thick) was formed and subjected to sputtering to form a second metallic wiring layer 10 in the same way as said steps (a) and (b) as shown in FIG. 6G.

It is possible to produce a thin-film multilayer wiring substrate having three or more metallic wiring layers by repeating the above steps (d) to (g).

Figure 7:
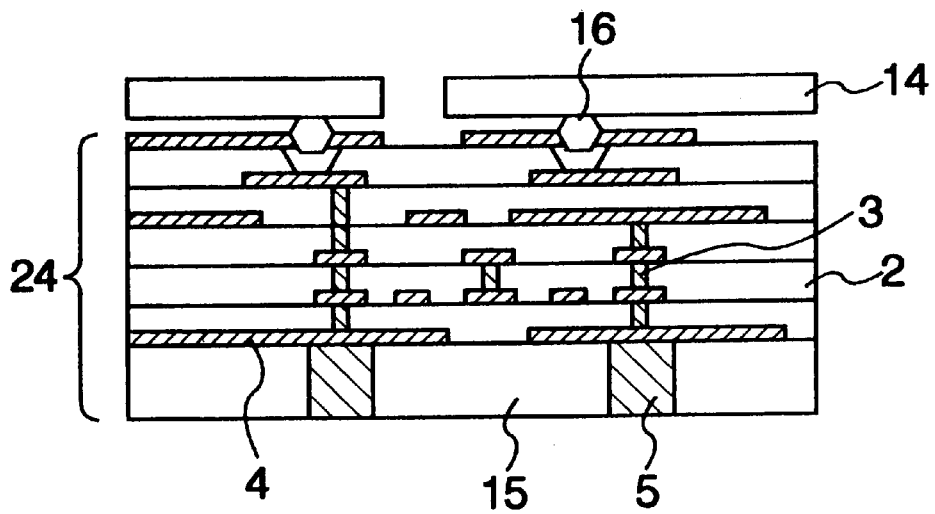
FIG. 7 is a schematic sectional view of a packaged structure using a thin-film multilayer wiring board according to the present invention.

FIG. 7 is a schematic sectional view of a packaged substrate having LSI 14 mounted on a thin-film multilayer wiring board 24 obtained in Example 1 described above. The polyimide/copper thin-film wiring layers were formed on a ceramic substrate 15 and connected by the via studs to constitute a thin-film multilayer wiring board 24, and LSI 14 was mounted on said board and connected by solder bumps 16.

EXAMPLE 2

FIGS. 8A to 8G are a flow chart showing an example of production process of a copper/polyimide thin-film multilayer wiring board, as illustrated by the schematic sectional views of the substrate in the respective steps, the process being carried out using a composite sheet in place of a half-cured polyimide adhesive sheet used in the step (c) of Example 1.

Said composite sheet 17 was obtained by forming on a polyimide sheet 19 an adhesive layer 18 composed of a dehydration condensed type polyimide resin having quinazoline rings in its chemical structure and a thermosetting maleimide resin having fluorine groups. The polyimide sheet 19 was 10 μm thick and the adhesive layer 18 was 10 μm thick.

The process was carried out following the same procedures as Example 1 except for the step (c) where the composite sheet was press bonded on the first metallic wiring layer at 280° C. under 15 kg/cm².

Formation of the via holes in the step (e) was performed using an oxygen gas plasma with a gas pressure of 3 Pa and an RF output of 800 W.

More in detail, the dry etching time required for forming the via holes 7 with a diameter of 30 μm and a height of 20 μm was about 100 minutes, and the dry etching rate of said composite sheet 17 was 0.2 μm/min, which were substantially the same as in the working of the polyimide layer in Example 1.

By repeating the step shown in FIG. 8D to the step shown in FIG. 8G a plurality of times, it is possible to form three or more metallic wiring layers.

EXAMPLE 3

FIGS. 9A to 9G are the schematic sectional views showing an example of production process of a copper/polyimide thin-film wiring board using a copper-clad composite sheet 20 comprising a composite sheet which was the same as used in Example 2 and a copper foil formed on the upper side of said sheet.

Said copper-clad composite sheet 20 was obtained by coating a copper-clad polyimide sheet with an adhesive composed of a dehydration condensed type polyimide resin having quinazoline rings in the chemical structure and a thermosetting maleimide resin having fluorine groups. The copper layer, the polyimide sheet and the adhesive layer were all 10 $\mu$m thick. Said copper layer serves as a dry etching mask 8 informing the via holes.

The process was carried out following the same procedure as Example 1 except for the step (c) where the copper-clad composite sheet was press bonded on said first metallic wiring layer at 280° C. under 15 kg/cm².

Formation of the via holes 7 in the step (e) was performed using an oxygen gas plasma with a gas pressure of 3 Pa and an RF output of 800 W.

In this embodiment, the dry etching time required for forming the via holes 7 with a diameter of 30 $\mu$m and a height of 20 $\mu$m was about 100 minutes (0.2 $\mu$m/min), which was substantially the same as the polyimide layer working rate in Example 1.

By repeating the step shown in FIG. 9D to the step shown in FIG. 9G a plurality of times, it is possible to form three or more metallic wiring layers.

EXAMPLE 4

An example of via stud connected board having 6 metallic wiring layers is shown by a schematic sectional view in FIG. 1.

In this Example was used a composite sheet in which the adhesive layer serving as an insulating layer 2 was composed of a dehydration condensed type polyimide resin having quinazoline rings in the chemical structure and a thermosetting maleimide resin having fluorine groups, and the via holes were formed by excimer laser. As in the preceding embodiments, layer multiplication was effected by via stud connection of layers to provide a thin-film multilayer wiring board.

EXAMPLE 5

Figure 10:
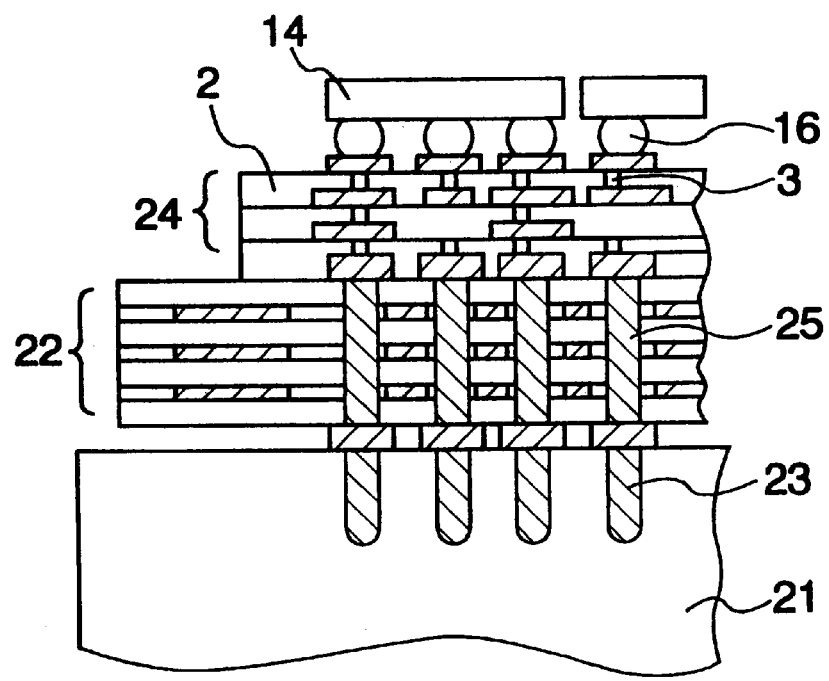
FIG. 10 is a schematic sectional view showing an example of packaging with a board for a large-sized electronic computer according to the present invention.

FIG. 10 is a schematic sectional view showing an example of packaging in which a thin-film multilayer wiring board obtained according to Example 1 is used as a large-sized computer substrate. This is an example wherein a pin-connected type module substrate 22 is mounted on a large-sized printed wiring board 21.

The module substrate 22 comprises a multilayer sintered body of glass-reinforced ceramic and copper layers and has the connecting pins 23 secured to its underside. A thin-film multilayer wiring board 24 according to the present invention is formed on said module substrate 22, and LSI 14 is mounted thereon and connected by solder bumps 16. Numeral 25 denotes a through-hole.

According to the packaging substrate of this embodiment of the invention, it was possible to reduce the total number of wires to about ¼ and to increase the wiring density. Also, the signal transmission speed can be raised to about 1.5-fold as compared with the conventional substrates.

The manufacturing cost of the packaging substrate can be reduced to ½ or less as a whole.

The thin-film multilayer wiring board according to the present invention is capable of realizing an increase of packaging density and speed-up of signal transmission by reduction of wire length. Also, the production process can be remarkably shortened by employing a sheet-like insulating layer (for example, said polyimide composite sheet).

The thin-film multilayer wiring board according to the present invention is excellent as a substrate for large-sized electronic computers, a packaging substrate for work stations, packaging substrate for small-sized electronic devices such as video camera, etc.

What is claimed is:

1. A process for producing a thin-film multilayer wiring board, which comprises
    attaching an insulating adhesive sheet to a substrate having a first metallic wiring layer on its surface to form an insulating layer;
    forming via holes in said insulating layer by dry etching or-laser work;
    filling said via holes with a conductive metal by electroless plating to form via studs;
    grinding out portions of said via studs projecting from the insulating layer to make said insulating layer surface flat; and
    forming a second metallic wiring layer on said insulating layer and connecting it to said via studs.

2. A process for producing a thin-film multilayer wiring board, which comprises the steps of:
    (1) laminating a composite sheet comprising a carrier sheet and an adhesive layer on a substrate having a first metallic wiring layer on the surface thereof so as to contact the adhesive layer with the first metallic wiring layer;
    (2) removing said carrier sheet and hardening the adhesive layer to form an insulating layer;
    (3) forming via holes in said insulating layer;
    (4) filling said via holes with a conductive metal by electroless plating;
    (5) grinding out projected portions of the conductive metal from the surface of said insulating layer to flatten the conductive metal and to-form via studs; and
    (6) forming a second metallic wiring layer on said insulating layer and connecting it to said via studs.

3. The process according to claim 2, wherein said composite sheet comprises an organic carrier sheet having an organic adhesive layer formed thereon.

4. The process according to claim 2, wherein said via holes are formed by dry etching using a plasma of $O_2$, $CF_4$, or a mixed gas thereof.

5. The process according to claim 2, wherein the plasma of $O_2$, $CF_4$ or a mixed gas thereof used for forming said via holes has a gas pressure of 5 Pa or below.

6. The process according to claim 2, wherein said via holes are formed by excimer laser.

7. The process according to claim 2, wherein said via holes are formed by conformal mask working using excimer laser.

8. The process according to claim 2, wherein said adhesive layer is composed of a dehydration condensed type polyimide resin having quinazoline rings and a thermosetting maleimide resin having fluorine groups.

9. The process according to claim 1, which further comprises repeating the step of attachment of an insulating adhesive sheet to the step of formation of a second metallic wiring layer a plurality of times.

10. The process according to claim 1, wherein a chromium layer is interposed between the insulating layer and the via stud, and wherein the via stud is copper.

11. The process according to claim 2, wherein said via holes are formed by dry etching or laser work.

12. The process according to claim 1, wherein said conductive metal is selected from the group consisting of copper, gold, nickel and silver.

13. The process according to claim 2, wherein said conductive metal is selected from the group consisting of copper, gold, nickel and silver.

14. The process according to claim 6, wherein said insulating layer is a first insulating layer, and wherein the process further includes a step of forming a second insulating layer both on said second wiring layer and on said first insulating layer.

15. The process according to claim 14, further including a step of forming a via hole in said second insulating layer and forming a via stud in said via hole in said second insulating layer.

16. The process according to claim 11, which further comprises repeating the steps (1) through (6) a plurality of times.

* * * * *